United States Patent
Mazda et al.

(10) Patent No.: US 7,283,001 B2
(45) Date of Patent: Oct. 16, 2007

(54) NOISE-SHAPING AMPLIFIER WITH WAVEFORM LOCK

(75) Inventors: Babak Mazda, Mountain View, CA (US); Farzad Sahandiesfanjani, Santa Clara, CA (US); Adya S. Tripathi, San Jose, CA (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/432,291

(22) Filed: May 10, 2006

(65) Prior Publication Data

US 2006/0261901 A1    Nov. 23, 2006

Related U.S. Application Data

(60) Provisional application No. 60/681,062, filed on May 12, 2005.

(51) Int. Cl.
*H03L 7/00* (2006.01)

(52) U.S. Cl. ......................................... 331/1 A; 331/25
(58) Field of Classification Search ................ 770/1 A, 770/18, 25, 17
See application file for complete search history.

(56) References Cited

U.S. PATENT DOCUMENTS

| | | | |
|---|---|---|---|
| 5,777,512 A | 7/1998 | Tripathi | |
| 5,923,707 A * | 7/1999 | Tanaka et al. | 375/232 |
| 6,107,891 A * | 8/2000 | Coy | 331/18 |
| 6,157,271 A * | 12/2000 | Black et al. | 332/127 |
| 6,628,166 B2 | 9/2003 | Delano | |

* cited by examiner

*Primary Examiner*—Henry Choe
(74) *Attorney, Agent, or Firm*—Beyer Weaver LLP

(57) ABSTRACT

A generalized amplifier architecture is described which employs noise-shaping feedback, and for which the output waveform closely resembles the input waveform.

5 Claims, 3 Drawing Sheets

NOISE-SHAPING AMPLIFIER WITH WAVEFORM LOCK

RELATED APPLICATION DATA

The present application claims priority under 35 U.S.C. 119(e) to U.S. Provisional Patent Application 60/681,062 for MODIFIED SIGMA-DELTA ARCHITECTURE WITH FREQUENCY LOCK filed on May 12, 2005 the entire disclosure of which is incorporated herein by reference for all purposes.

BACKGROUND OF THE INVENTION

The present invention relates to switching amplifiers and more specifically to techniques which enable switching amplifier architectures which employ noise-shaping feedback techniques to generate output waveforms which more closely resemble their input waveforms than conventional architectures.

Typical digital audio systems generate a one-bit digital signal (single-ended or differential) with some form of modulation, e.g., pulse width modulation (PWM), to a digital amplifier for amplification. The audio information is represented by the timing of transitions in this one-bit signal which is typically in the frequency range of 200 kHz to 1 MHz. This signal is also often enhanced by some form of digital audio processing before amplification. Most such systems employ an a priori approach for mitigating distortion, i.e., the signal processing attempts to mitigate expected distortion from subsequent stages. However, such an approach is largely ineffective with regard to the largest source of distortion in the system, i.e., the power stage. In fact, many of most sophisticated digital audio signal processing solutions available today ignore, and are therefore rendered ineffective by power stage distortion.

One highly successful approach to eliminating or reducing power stage distortion was pioneered by Tripath Technology Inc. of San Jose, Calif. This approach employs a modified, oversampled, sigma-delta modulator architecture which uses continuous-time feedback from the output of the power stage to effectively push the power stage distortion out of the band of interest. Such a noise-shaping approach is described in detail in U.S. Pat. No. 5,777,512, the entire disclosure of which is incorporated herein by reference.

As described in that patent, specific implementations of the modified sigma-delta modulator accept an analog input. Thus, when such modulators are integrated with audio systems which employ a digital format for the source, e.g., virtually all audio systems today, this makes some form of digital-to-analog (D/A) conversion necessary. Thus, despite the significant reduction in the distortion of the output signal, inclusion of this D/A conversion adds to the cost and complexity of the overall system.

In addition, some implementations using the approach described in the above-referenced patent result in output waveforms having characteristics which do not always closely resemble the input waveforms with regard to one or more characteristics, e.g., frequency. While the introduction of such artifacts may be acceptable from some applications, e.g., some audio applications, there are other applications for which such artifacts are undesirable.

It is therefore desirable to mitigate power stage distortion switching amplifier architectures while faithfully reproducing input waveforms at the amplifier output.

SUMMARY OF THE INVENTION

According to the present invention, a generalized amplifier architecture is provided which employs noise-shaping feedback and for which the output waveform is "locked" to the input waveform, i.e., the output waveform closely resembles the input waveform.

According to a specific embodiment, a noise-shaping amplifier is provided. Phase detection circuitry is operable to receive an input signal characterized by an input frequency, and to detect a phase difference between the input signal and a feedback signal and generate a control signal representative of the phase difference. Filter circuitry characterized by a filter response corresponding to a band of interest is operable to filter the control signal. Voltage-controlled oscillator (VCO) circuitry is operable to receive the filtered control signal and generate an output signal in response thereto. The output signal is characterized by an output frequency which is substantially locked to the input frequency. The VCO circuitry includes an output power stage. Feedback circuitry is operable to provide the feedback signal to the phase detection circuitry. The feedback circuitry is further operable in conjunction with at least some of the phase detection circuitry, the filter circuitry, and the VCO circuitry to move at least some distortion generated by the output power stage outside of the band of interest.

According to another specific embodiment, a signal processing circuit characterized by an operating frequency is provided. The circuit includes a frequency selective network operable to receive an input signal characterized by an input frequency. A sampling stage is operable to sample an output of the frequency selective network. A power amplification stage is operable to amplify an output of the sampling stage. At least one internal feedback path is provided from the output of the sampling stage to the frequency selective network. Each internal feedback path is part of a corresponding internal loop. At least one external feedback path is provided from an output of the power amplification stage to the frequency selective network. Each external feedback path is part of a corresponding external loop. Delays associated with the internal and external loops are selected such that the operating frequency is locked to the input frequency during operation of the circuit.

According to yet another specific embodiment, a signal processing circuit characterized by an operating frequency is provided. A frequency selective network is operable to receive an input signal characterized by an input frequency. The frequency selective network includes a plurality of integrator stages. A sampling stage is operable to sample an output of the frequency selective network. A power amplification stage is operable to amplify an output of the sampling stage. At least one internal feedback path is provided from the output of the sampling stage to the frequency selective network. Each internal feedback path includes a resistor and a capacitor, and is part of a corresponding internal loop. At least one external feedback path is provided from an output of the power amplification stage to the frequency selective network. Each external feedback path is part of a corresponding external loop. At least one external loop includes a delay element. The resistor, the capacitor, and the delay associated with the delay element are selected such that the operating frequency is locked to the input frequency during operation of the circuit.

A further understanding of the nature and advantages of the present invention may be realized by reference to the remaining portions of the specification and the drawings.

DETAILED DESCRIPTION OF SPECIFIC EMBODIMENTS

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

The present invention provides a loop architecture in which the output waveform substantially reproduces the input waveform in terms of its frequency & pulse width. The resemblance of the output waveform to the input waveform is primarily dependent on the severity of the distortion added by the output stage. In essence, the output waveform will closely follow the input waveform in terms of frequency & pulse width, with only minimal changes being made to correct for all sources of distortion in the loop, i.e., a waveform-locked loop.

As will be described, this loop architecture employs noise-shaping techniques which move distortion introduced by the power stage of the loop outside of the band of interest. First, a specific embodiment of the invention will be described in which the noise-shaping technique employed is a modified sigma-delta technique. It should be noted, however, that other noise-shaping techniques may be used to implement a loop architecture without departing from the scope of the invention. A more generalized waveform-locked loop is then described below.

Figure 1:
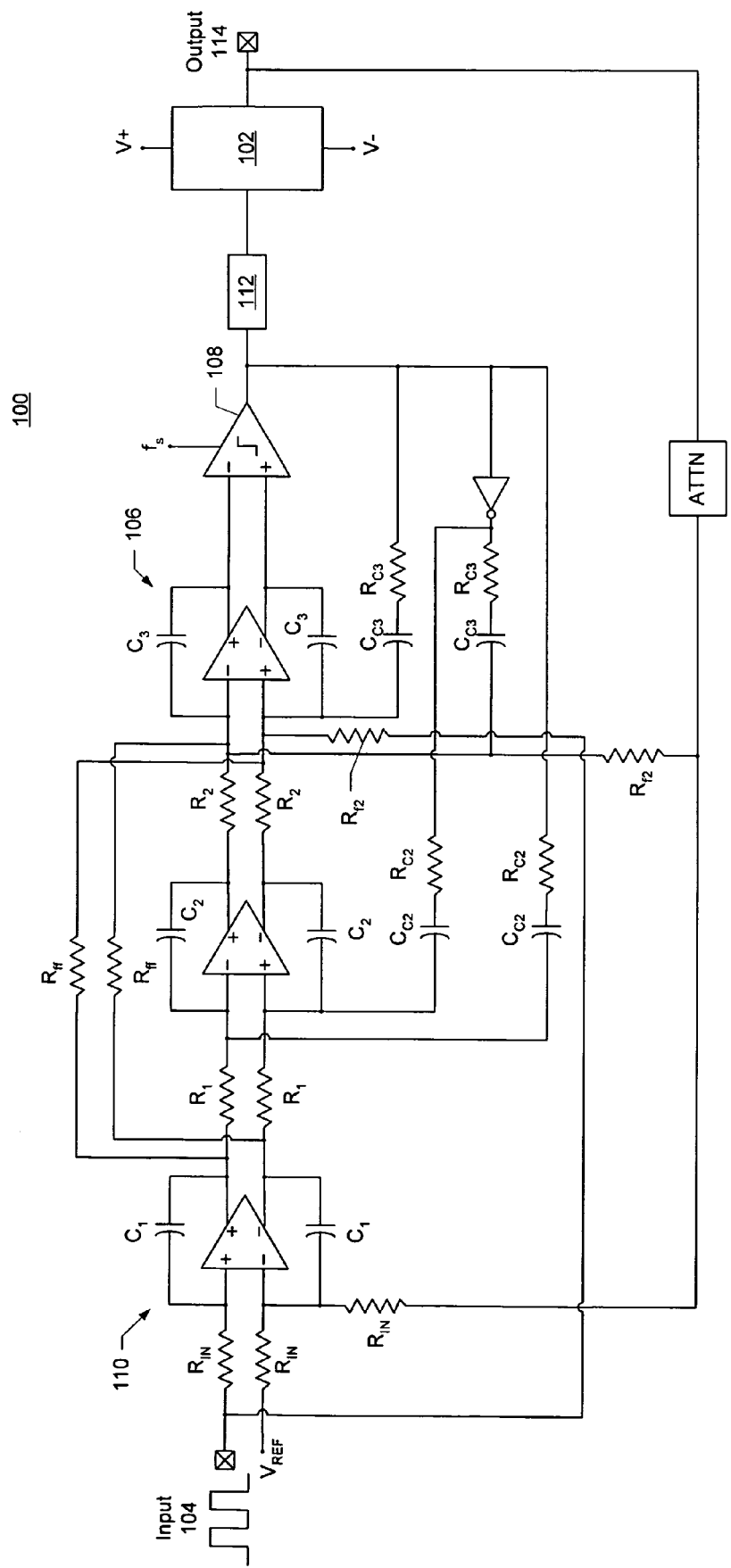
FIG. 1 is a simplified schematic diagram of a modified sigma-delta loop architecture designed according to a specific embodiment of the invention.

According a specific embodiment illustrated in FIG. 1, a modified sigma-delta modulator architecture is operable to receive a digital input signal, e.g., a PWM signal, without the need for D/A conversion because the loop or operating frequency of the modulator is locked to the frequency of the digital input signal. In addition, the output waveform is a significantly more faithful reproduction of the input waveform (i.e., waveform lock) than the output waveforms of previous architectures.

FIG. 1 depicts a modified, oversampled, third-order sigma delta modulator 100 driving a power stage 102 according to a specific embodiment of the invention. As will be understood, the oversampling ratio is given by $f_s/2f_0$, where $2f_0$ is the Nyquist rate, i.e., twice the bandwidth $f_0$ of the baseband signal.

The inputs in this differential implementation are compatible with a digital signal, e.g., a PWM signal, although analog signals may also be received. Not only does this approach achieve the desired noise shaping from the loop regarding single bit conversion (high SNR) in the base band, but an inherent frequency or waveform locking to the input waveform also takes place which forces the output frequency of power stage 102 to be substantially the same as the input frequency.

Put another way, configured in this manner, sigma delta converter 100 is inherently a delay locked loop. This may be understood with reference to the case in which the signal input 104 is digital in form. Third integrator 106 and sampling stage 108 (a comparator in this embodiment) together act as a delay element in the loop. The signal introduced to the differential inputs of third integrator 106 determines how fast the integrator is charging or discharging, i.e., if the value of this input is high, the integrator charges more rapidly and the comparator responds faster than if the value of this input is low. The summing node in first integrator 110, i.e., where the feedback and the input signal converge, acts as a phase detector and a charge pump for the loop.

Any discrepancy between the input frequency and the output frequency is manifested as an error which the delay-locked loop corrects. The base band information, e.g., the actual audio signal to be amplified, is processed by the sigma delta loop which acts like a linear amplifier. Thus, sigma delta converter 100 configured as shown in FIG. 1 acts as a base band amplifier and a delay-locked loop.

Appropriate tuning of internal and external loop delays allow sigma delta converter 100 to lock to a range of input frequencies. To tune the delay associated with the external loop (i.e., the loop including the power stage and the continuous-time feedback from the output 114 of the power stage to the integrators), a delay line 112 may be inserted in the external loop as shown. According to some embodiments, delay line 112 may be adjustable to support multiple input frequencies in a single design. To tune the delay associated with the internal loop(s) (i.e., the loops created by feedback from the comparator output to the integrators), appropriate values of feedback components $R_{C2}$ and $C_{C2}$, and $R_{C3}$ and $C_{C3}$ may be selected.

Additional details regarding exemplary techniques for base band and band pass noise-shaping which may be suitable with specific embodiments of the invention are provided in U.S. Pat. Nos. 5,777,512 and 6,628,166, the entire disclosures of which are incorporated herein by reference for all purposes.

Figure 2:
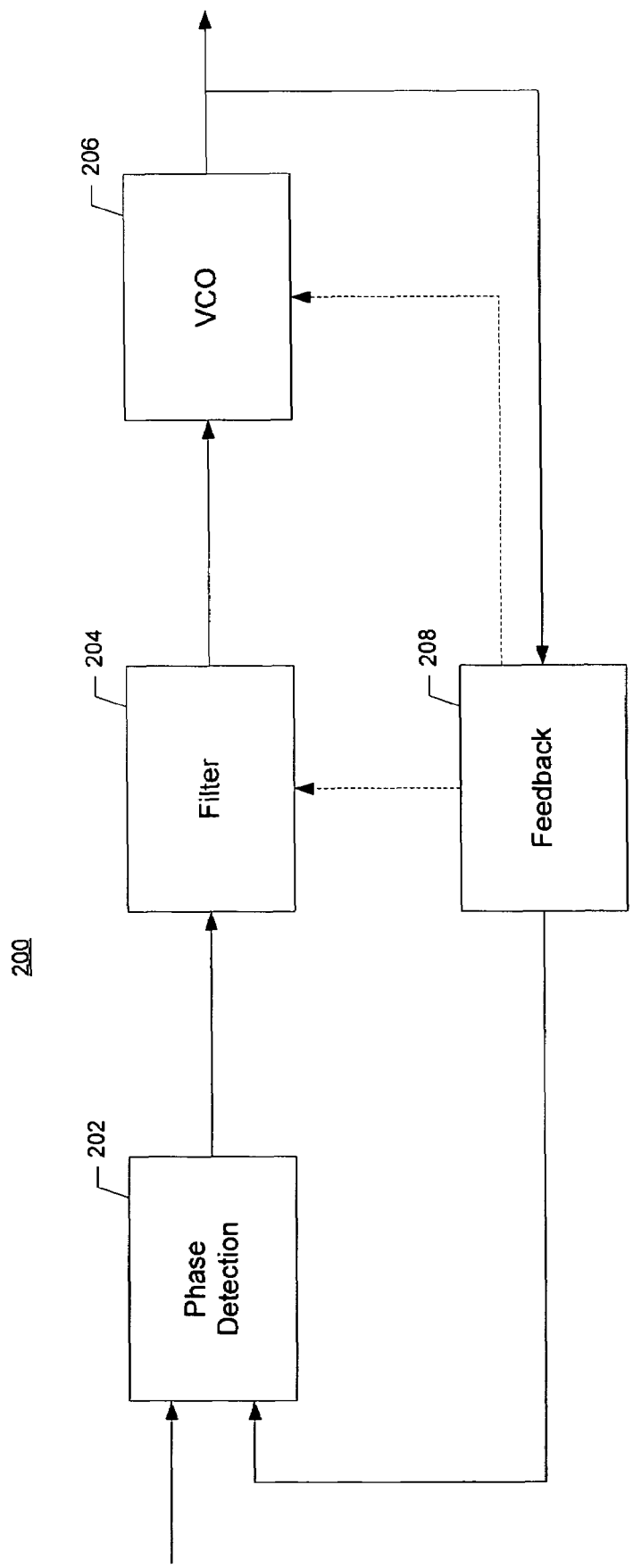
FIG. 2 is a block diagram of a generalized waveform-locked loop designed according to the present invention.

The loop architecture of FIG. 1 exhibits behavior similar to a phase-locked loop (PLL) with noise-shaping feedback and can therefore be represented by the more generalized diagram of loop 200 shown in FIG. 2. As is well known, PLLs generally include a phase detector, a filter, and a voltage-controlled oscillator (VCO) in a negative feedback loop. There may be a divider in the feedback path, in the reference path, or both, in order to make the PLL's output frequency a rational multiple of the reference. If the phase from the VCO output differs from that of the reference signal (as detected by the phase detector), this is applied as a control to a charge pump associated with the VCO to change the VCO's control voltage such that the VCO's output frequency is adjusted accordingly and the difference is minimized or eliminated. The filter smoothes out the abrupt control inputs from the charge pump.

Referring now to FIG. 2, a phase detection block 202 receives the input signal which may be likened to the reference signal of a PLL. The phase detection functionality of block 202 may be implemented in a variety of ways such as, for example, with a sample-and-hold circuit, a flip-flop, a mixer, a multiplier, exclusive-OR, etc. Filter block 204 filters the phase-detected signal with a filter response which is suitable for the band of interest of the particular application, e.g., low pass or band pass. Voltage-controlled oscillator (VCO) block 206 receives the filtered signal and provides an output signal, the frequency of which is locked to that of the input signal using feedback 208 back to phase detection block 202. As mentioned above, feedback 208 may include divider functionality to enable the capability of locking the output waveform to different multiples of the input frequency.

VCO block 206 includes a power switching stage (not shown) which introduces distortion into the loop which is mitigated by the noise-shaping capabilities inherent in feedback 208. The details of one particular feedback scheme, i.e., a modified sigma-delta technique, which provides such a noise-shaping effect are shown in the implementation of FIG. 1. However, it is contemplated that a variety of techniques for applying noise-shaping feedback may be employed according to different embodiments of the invention. This notion is represented by the dashed lines entering blocks 204 and 206.

The basic architecture shown in FIG. 2 may be used to implement a wide variety of switching amplifiers. For example, the present invention may be employed to implement pulse-width modulators, sigma-delta modulators, modified sigma-delta modulators, pulse density modulators, etc. Generally speaking the architecture of the present invention is agnostic to the modulation and/or coding scheme employed to represent the original input signal. In addition, any of these types of architectures may be employed with the present invention in a wide variety of base band and band pass applications such as, for example, base band amplification (e.g., audio amplifiers), motor control applications, power factor correction, switching regulators, resonant mode switching.

Figure 3:
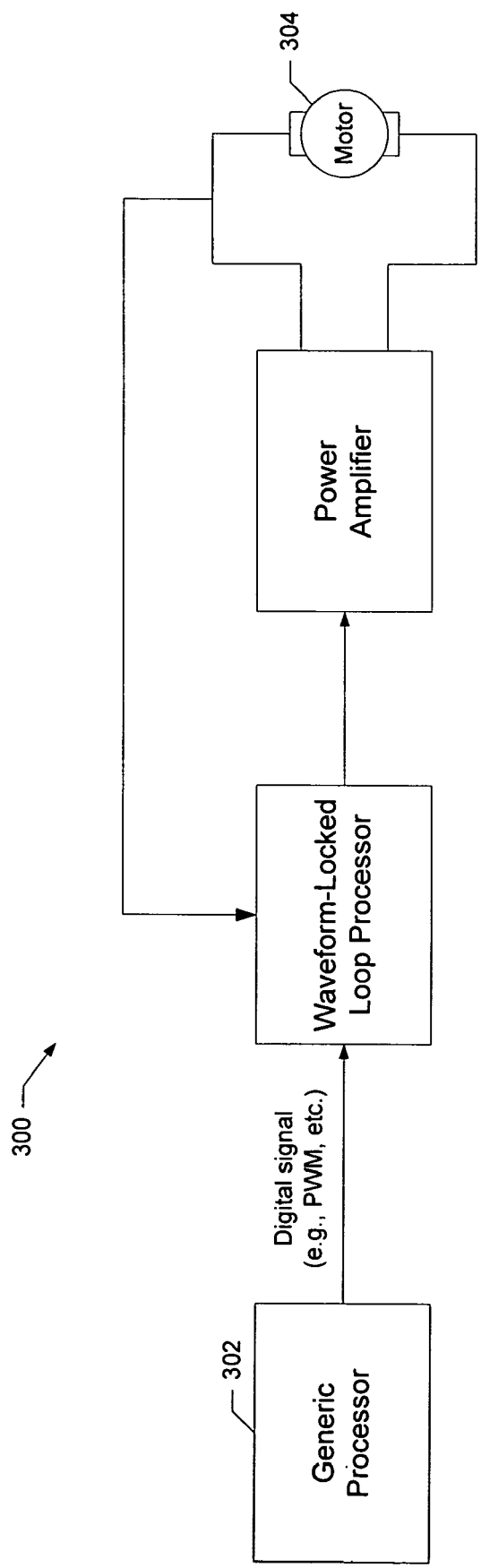
FIG. 3 is a block diagram of a waveform-locked loop implemented as a motor controller.

An exemplary motor control application is depicted in FIG. 3. In accordance with the present invention, modulator 300 is operable to faithfully reproduce sinusoidal or trapezoidal waveforms from a generic DSP 302 to control motor 304.

While the invention has been particularly shown and described with reference to specific embodiments thereof, it will be understood by those skilled in the art that changes in the form and details of the disclosed embodiments may be made without departing from the spirit or scope of the invention. For example, both single-ended and differential embodiments of the invention are contemplated. In addition, the basic architecture described is operable to receive both analog and digital inputs. That is, even though loop architectures designed according to the present invention effectively treat all inputs as analog inputs, the ability to lock the loop or operating frequency to the frequency or waveform of the input signal allow such amplifiers to directly receive digital inputs, and particularly digital inputs with fixed frequencies. Generally speaking, the loop is agnostic to the input signal type.

In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A noise-shaping amplifier, comprising:
   phase detection circuitry operable to receive an input signal characterized by an input frequency, the phase detection circuitry being operable to detect a phase difference between the input signal and a feedback signal and generate a control signal representative of the phase difference;
   filter circuitry characterized by a filter response corresponding to a band of interest, the filter circuitry being operable to filter the control signal;
   voltage-controlled oscillator (VCO) circuitry operable to receive the filtered control signal and generate an output signal in response thereto, the output signal being characterized by an output frequency which is substantially locked to the input frequency, the VCO circuitry including an output power stage; and
   feedback circuitry operable to provide the feedback signal to the phase detection circuitry, the feedback circuitry further being operable in conjunction with at least some of the phase detection circuitry, the filter circuitry, and the VCO circuitry to move at least some distortion generated by the output power stage outside of the band of interest.

2. The noise-shaping amplifier of claim 1 wherein the feedback circuitry and the at least some of the phase detection circuitry, the filter circuitry, and the VCO circuitry employ a modified-sigma delta modulation noise-shaping technique.

3. The noise-shaping amplifier of claim 1 wherein the filter circuitry comprises one of a band pass filter and a base band filter.

4. The noise-shaping amplifier of claim 1 configured as one of an audio amplifier, a motor controller, a power factor correction module, a switching regulator, a resonant mode switching module, a power supply controller.

5. The noise-shaping amplifier of claim 1 wherein the output power stage is configured as one of single-ended and differential.

\* \* \* \* \*